(12) United States Patent
Tsutsui

(10) Patent No.: US 6,248,607 B1
(45) Date of Patent: Jun. 19, 2001

(54) METHOD FOR MANUFACTURING SEMICONDUCTOR LIGHT EMITTING DEVICE

(75) Inventor: Tsuyoshi Tsutsui, Kyoto (JP)

(73) Assignee: Rohn Co., Ltd., Kyoto (JP)

(*) Notice: Subject to any disclaimer, the term of this patent is extended or adjusted under 35 U.S.C. 154(b) by 0 days.

(21) Appl. No.: 09/391,624

(22) Filed: Sep. 7, 1999

(30) Foreign Application Priority Data

Sep. 7, 1998 (JP) .................................................. 10-252520

(51) Int. Cl.[7] .................................................. H01L 21/00
(52) U.S. Cl. .................................. 438/46; 438/22; 438/47; 438/906; 438/909
(58) Field of Search ........................ 438/22, 46, 47, 438/906, 909; 148/DIG. 3, DIG. 17

(56) References Cited

U.S. PATENT DOCUMENTS 4,391,854 * 7/1983 Kanda et al. .
5,771,110 * 6/1998 Hirano et al. ........................ 257/72
5,821,158 * 10/1998 Shishiguchi .......................... 438/528
5,851,842 * 12/1998 Katsumata et al. .................. 438/9
5,963,787 * 10/1999 Kimura et al. ...................... 438/46

* cited by examiner

Primary Examiner—Long Pham
(74) Attorney, Agent, or Firm—Arent Fox Kintner Plotkin & Kahn, PLLC

(57) ABSTRACT

In a method for manufacturing semiconductor light emitting device, when a gallium nitride based compound semiconductor layers which include at least an n-type layer and p-type layer and which form a light emitting layer, are laminated on a substrate and heat treatment is performed for activation of the p-type layer of the laminated semiconductor layers, the heat treatment is performed under an atmosphere including oxygen. With this arrangement, the heat treatment for activating the p-type layer of the laminated semiconductor layers comprising gallium nitride based compound semiconductor can be performed in a short time and moreover to reliably perform activation.

6 Claims, 2 Drawing Sheets

METHOD FOR MANUFACTURING SEMICONDUCTOR LIGHT EMITTING DEVICE

FIELD OF THE INVENTION

The present invention relates to a method for manufacturing semiconductor light emitting device such as light emitting diode or semiconductor laser employing gallium nitride based compound semiconductor for generating light of blue type (blue to yellow) having a high luminance. More particularly, the present invention relates to a method for manufacturing semiconductor light emitting device wherein annealing treatment for activating a p-type layer can be performed in a short time to achieve sufficient activation thereof.

BACKGROUND OF THE INVENTION

Semiconductor light emitting chips (hereinafter referred to as "LED chips") generating blue type light are conventionally manufactured in the following manner. As shown in FIG. 2, there are sequentially formed, through epitaxial growth onto a sapphire substrate 21, an n-type layer (cladding layer) 23 of e.g. n-type GaN, an active layer (light emitting layer) 24 of e.g. InGaN based compound semiconductor (wherein the ratio of In and Ga may be varied as it similarly applies hereinafter) which is a material which band gap energy is smaller than that of the cladding layer and which determines the light 25 emitting wavelength, and a p-type layer (cladding layer) of p-type GaN. Annealing treatment for activating a p-type layer can be performed i atmosphere of vacuum condition, nitrogen gas, inert gas, or the like. A p-side electrode 28 is formed onto a surface of the substrate with a current diffusion layer 27 interposed between, and a part of the laminated semiconductor layers are etched so that an n-side electrode 29 is formed on the exposed surface of the n-type layer 23. Thereafter, by dividing the wafer into individual chips, LED chips as shown in FIG. 2 can be obtained.

As mentioned above, in conventional methods of manufacturing semiconductor light emitting device employing gallium nitride based compound semiconductor, annealing treatment is performed after laminating the semiconductor layers in order to activate the p-type layer. This annealing is performed, as mentioned, in a vacuum condition or in an inert gas atmosphere. Such treatment is taken because surfaces of gallium nitride based compound semiconductors are slightly oxidized in case of undergoing heat treatment at approximately 600° C. at an oxygen atmosphere though it presents stability against corrosion, so that adhesion with a current diffusion layer that is to be formed thereon or electrical characteristics such as electrical conductivity are degraded.

However, it is conventionally required to perform annealing treatment at high temperature ranging from 500 to 800° C. and for a long time of approximately 1 to 2 hours otherwise no sufficient activation can be achieved and the electrical resistance of the p-type layer can not be sufficiently decreased.

SUMMARY OF THE INVENTION

It is an object of the present invention to provide a method for manufacturing semiconductor light emitting device, wherein heat treatment for activation of the p-type layer of semiconductor light emitting device laminated with gallium nitride based compound semiconductor can be performed in a short time to reliably perform activation.

In repeatedly carrying out investigations on how to perform heat treatment for activation of the p-type layer in a short time, the inventor has found that the reason why the p-type layer is not sufficiently activated and the electric resistance not decreased in the absence of heat treatment is that H of carrier gas $H_2$ or reactive gas $NH_3$ that is used at the time of laminating the semiconductor layers is bound to Mg used as a dopant for the p-type layer so that Mg does not function as a dopant but provides high resistance. Thus, the inventor has found out that activation treatment can be performed in a short time by performing heat treatment at an atmosphere in which H (hydrogen atom) can be easily drawn out.

In a method of manufacturing semiconductor light emitting device according to the present invention, when a gallium nitride based compound semiconductor layers which includes at least an n-type layer and p-type layer which forms a light emitting layer, are laminated on a substrate and heat treatment is performed for activation of the p-type layer of the laminated semiconductor layers, the heat treatment is performed at an atmosphere including oxygen.

Here, an atmosphere including oxygen indicates an atmosphere having an oxygen content ranging from several tenths % up to 100% expressed in volume ratios, that is, an atmosphere including a minute amount of oxygen within inert gas up to an atmosphere of oxygen only, and the oxygen is not limited to be directly contained by may be oxidized gas such as ozone or $N_2O$. Further, a gallium nitride based compound semiconductor refers to a semiconductor comprising a compound having Ga of III group elements and N of V group elements, wherein one part or all of Ga of III group elements may be substituted by other III group elements such as Al or In and/or a part of N of the V group elements may be substituted by other V group elements such as P or As.

By employing this method, oxygen residing in the periphery of the laminated semiconductor layer draws H that has combined with Mg within the p-type layer since oxygen is easily combined with hydrogen so that H and O are compound. Consequently, H that is hardly drawn upon combining within the p-type layer can be easily drawn so that Mg is in a free condition and ready to sufficiently function as a dopant. Thus, activation treatment can be performed in a short time.

More particularly, the method of the present invention comprises the steps of (a) sequentially laminating on a substrate a buffer layer, an n-type layer, an activation layer and a p-type layer of gallium nitride based compound semiconductor, (b) performing activation treatment by putting the substrate laminated with semiconductor layers into a heating furnace for activating the p-type layer at an atmosphere including oxygen, (c) performing cleaning treatment for removing an oxidation film that is formed on a surface of the semiconductor layers during processes of the activation treatment, (d) forming a current diffusion layer on a surface of the p-type layer that has been purified during processes of the cleaning treatment, (e) removing a part of the current diffusion layer and laminated semiconductor layers through etching to expose the n-type layer, and (f) forming electrodes on the exposed n-type layer and on the p-type layer, respectively in an electrical connected manner.

In this manner, oxidation will not progress as far as to the interior though an oxidation film may be formed on the surface of the semiconductor layers by performing heat treatment in the presence of oxygen, and by purifying the surface through cleaning treatment, the adhesion with the current diffusion layer can be improved so that the electric resistance at the interface can be sufficiently decreased.

In case the atmosphere including oxygen is an air atmosphere or an atmosphere partially containing air in inert gas, the activation treatment can be performed in an ordinary heat treatment furnace.

DETAILED DESCRIPTION

Figure 1:
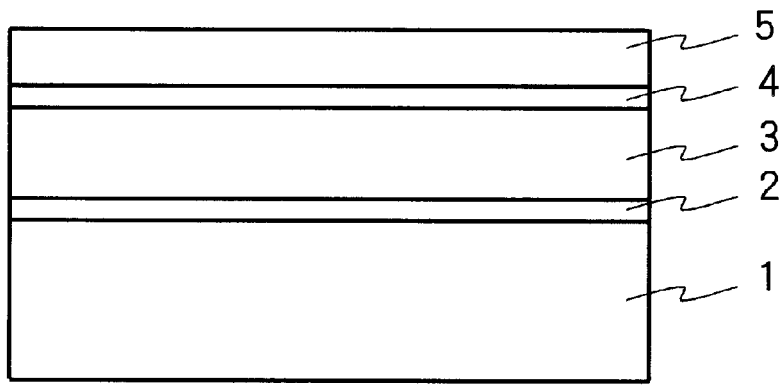
FIG. 1 (a) to 1 (c) are diagrams for explaining processes according to one embodiment of the manufacturing method of the present invention.
Figure 1:
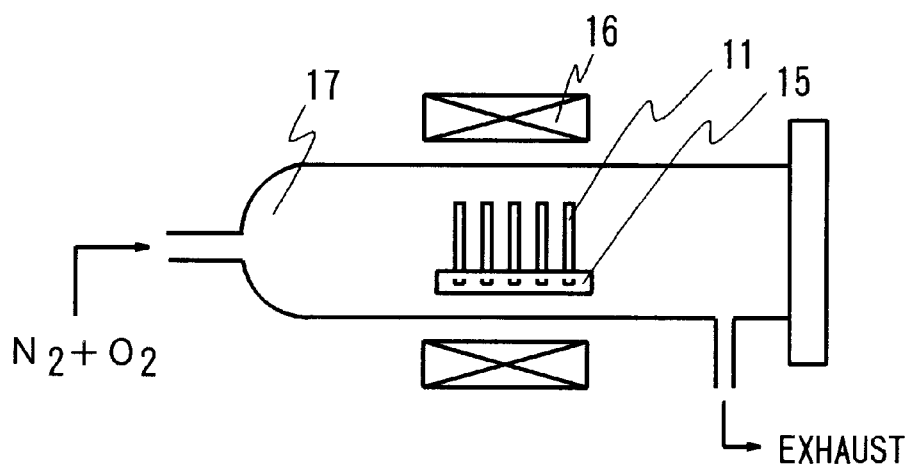
Figure 1:
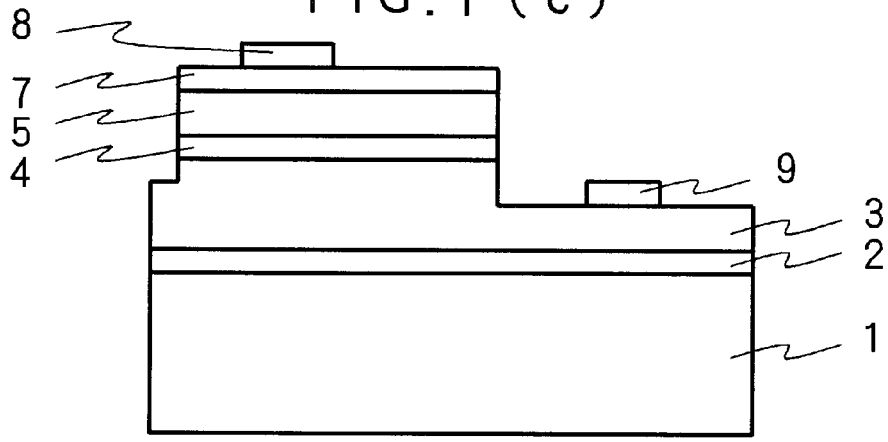
Figure 2:
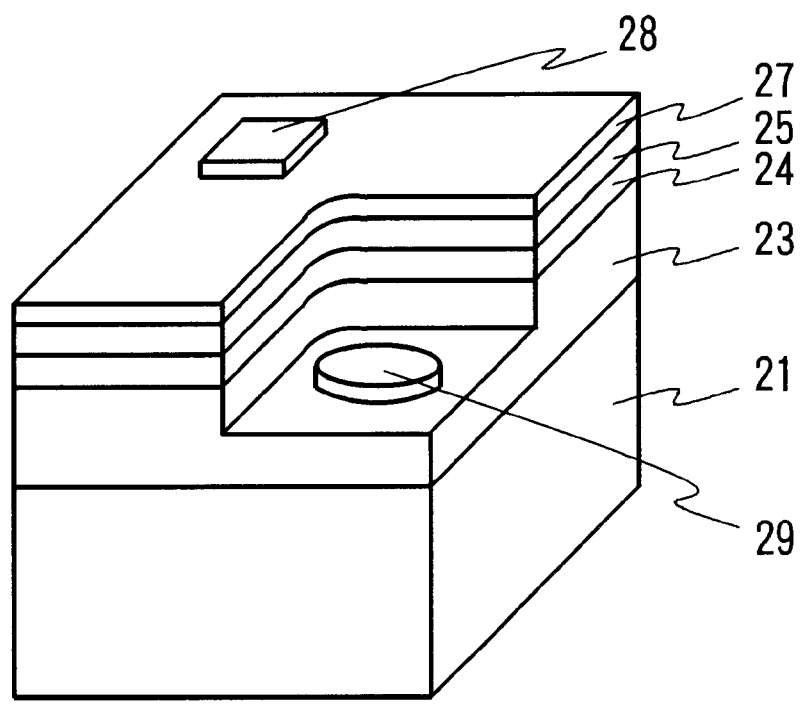
FIG. 2 is a sectional explanatory view of an example of conventional blue type semiconductor light emitting device.

FIG. 1 is a diagram for explaining processes according to one embodiment of the manufacturing method of the present invention wherein a gallium nitride based compound semiconductor layer suitable for generating light of high luminance ranging from blue to yellow is laminated on a wafer form sapphire substrate for manufacturing LED chips.

First, as shown in FIG. 1(a), semiconductor layers forming a light emitting layer and including a first conductivity type semiconductor layer (p-type layer 5) and a second conductivity type semiconductor layer (n-type layer 3) is grown on a substrate 1.

More detailed explanations will follow. For laminating semiconductor layers through e.g. metal organic chemical vapor deposition method (MOCVD method), reactive gas and required dopant gas is introduced, and there are respectively grown onto a substrate 1 of e.g. sapphire ($Al_2O_3$ single crystal) a low temperature buffer layer 2 of GaN, an n-type layer 3 which is the cladding layer including an n-type GaN and/or AlGaN based compound semiconductor (wherein the ratio of In and Ga may be varied as it similarly applies hereinafter) with a layer thickness of approximately 1 to 5 $\mu$m, an active layer 4 which may be an InGaN based compound semiconductor layer or any material which bandgap energy will be smaller than that of the cladding layer with a layer thickness of approximately 0.05 to 0.3 $\mu$m, and a p-type layer (cladding layer) 5 of p-type AlGaN based compound semiconductor layer and/or GaN layer with a layer thickness of approximately 0.2 to 1 $\mu$m. It should be noted that the laminated semiconductor layers forming the light emitting layer does not necessary be of a double hetero junction structure as above mentioned by may also be of another structure such as pn junction structure.

Then, as shown in FIG. 1(b), a wafer (substrate) 11 having laminated thereon the semiconductor layers is mounted onto a boat 15, is inserted into a heating furnace including e.g. a quartz tube 17 having a heater 16, whereupon activation treatment is performed for 10 to 20 minutes at a temperature of 400 to 800° C. by making a mixed gas of $N_2$ and $O_2$ flow in. $O_2$ is used, as it will be discussed later, for the purpose of drawing out hydrogen (H) which has combined with the p-type dopant by entering the semiconductor layer at the time of laminating the p-type layer 5 onto the substrate, and sufficient effects may be obtained even with a small oxygen of contents while an excess amount thereof will do no harm either. Thus, the amount may range from not less than several tenth % up to 100% by volume ratio while a favorable amount is in the range of 1 to 100 vol %, preferable 10 to 30 vol % in view of easy handling, and more preferably approximately 20 vol % for actual use. With such ratios, activation treatment can be performed by supplying air and raising the temperature to a specified temperature in air without the necessity of preparing special gas, and the activation treatment may also be performed at an atmosphere wherein air is mixed to inert gas such as nitrogen. The oxygen does not necessarily be $O_2$ but may be gas of oxidized characteristics such as ozone or $N_2O$ as long as it is capable of functioning to draw hydrogen out.

Thereafter, the wafer 11 is taken out from the heating furnace and cleaning treatment is performed to remove an oxidation film that is formed on the surface of the semiconductor layers by using hydrochloric acid or hydrofluoric acid. After purifying the surface, Ni and Au are evaporated through e.g. vacuum evaporation, and by performing sintering at 400 to 700° C. for 5 to 20 minutes, a current diffusion layer 7 which is conductivity and is light transmitting is formed with a layer thickness of approximately 2 to 100 nm.

Then, as shown in FIG. 1(c), patterning is performed by forming a resist film onto the surface of the laminated semiconductor layers, and by performing etching a part of the current diffusion layer 7 and the laminated semiconductor layers 3 to 5, the n-type layer 3 is exposed. This etching may be performed through reactive ion etching using e.g. chloride gas, and in case of etching a semiconductor layer having a large thickness, etching can be performed by using e.g. Ti as a mask.

Next, a p-side electrode 8 and n-side electrode 9 are respectively formed on the p-type layer 5 (current diffusion layer 7) on the surface of the laminated semiconductor layers and the n-type layer 3 which is exposed by removing a part of the semiconductor layers, respectively in an electrically connected manner. The n-side electrode 9 is formed in that Ti and Al are respectively formed in a form of a film through vacuum evaporation with a layer thickness of approximately 0.1 $\mu$m and 0.3 $\mu$m and sintered thereafter, and the p-side electrode 8 in that Ti and Au are respectively laminated through vacuum evaporation. As explained above, in case the current diffusion layer 7 is provided, the p-side electrode 8 is electrically connected to the p-type layer 5 via the current diffusion layer 7, and in case no diffusion layer 7 is provided, the p-side electrode 8 is electrically connected to the p-type layer 5 either in a direct manner or via another p-type semiconductor layer.

Then, the wafer is separated into individual chips to obtain LED chips as shown in FIG. 1(c).

According to the present invention, activation treatment for the p-type layer is performed at an oxygen atmosphere so that hydrogen (H) that is included in the p-type layer and combined with Mg which is the dopant can be drawn out thereby, and activation for separating the compound condition of Mg and H and functioning as a dopant can be performed in a short time. It was conventionally the case that in case the laminated semiconductor layers were exposed to an oxygen atmosphere, an oxidation film was formed on its surface so that cleaning the same was difficult and was also unfavorable in view of decreases in adhesion with a current diffusion layer formed thereafter or of increases in series electrical resistance. However, it has been found that by performing activation processes at an oxygen atmosphere, the activation processes can be performed in a short time, and additionally, the oxidation film formed at the time of activation is only formed on the surface in a short time which is easily removable by using hydrochloric acid or hydrofluoric acid. Consequently, while it took 1 to 2 hours for performing conventional activation treatment, sufficient activation can be performed in approximately 10 minutes by performing activation treatment at an atmosphere including 20 vol % of oxygen to obtain a p-type layer presenting satisfactorily low resistance.

According to the present invention, since hydrogen (H) included in the p-type layer can be sufficiently drawn out in a short time, activation of the p-type layer can be performed in a remarkably short time and activation treatment for the p-type layer can be completely performed. With this arrangement, the series electrical resistance is decreased and the luminescent efficiency improved, so that semiconductor light emitting device of high luminance for blue to yellow light can be obtained.

Further, since activation treatment can be reliably performed, loading effects wherein activation is insufficiently performed can be eliminated even if a large amount of substrates simultaneously undergo heat treatment, so that activation treatment can be efficiently performed at identical conditions as when performing heat treatment with a small amount of substrates. This, in turn, contributes to decreases in costs.

Although preferred example have been described in some detail, it is to be understood that certain changes can be made by those skilled in the art without departing from the spirit and scope of the invention as defined by the appended claims.

What is claimed is:

1. A method for manufacturing a semiconductor light emitting device, comprising steps of:

laminating gallium nitride based compound semiconductor layers which include at least an n-type layer and p-type layer and which form a light emitting layer, on a substrate; and performing an activation treatment for activation of said p-type layer of the laminated semiconductor layer;

wherein said activation treatment is performed at an atmosphere including oxygen and at a high temperature.

2. The manufacturing method of claim 1 wherein said activation treatment is performed with said atmosphere including oxygen being an atmosphere including oxygen by 1 to 100 vol %.

3. The manufacturing method of claim 1 wherein said activation treatment is performed with said atmosphere including oxygen being either an air atmosphere or an atmosphere in which air is partly mixed with inert gas.

4. The manufacturing method of claim 1 wherein a cleaning treatment is performed for removing an oxidation film formed on a surface after said activation treatment.

5. A method for manufacturing a semiconductor light emitting device, comprising the steps of:

(a) sequentially laminating on a substrate a buffer layer, an n-type layer, an active layer and a p-type layer of gallium nitride based compound semiconductor;

(b) performing an activation treatment by putting the substrate laminated with semiconductor layers into a heating furnace for activating said p-type layer at an atmosphere including oxygen;

(c) performing an cleaning treatment for removing an oxidation film that is formed on a surface of said semiconductor layers during processes of said activation treatment, (d) forming a current diffusion layer on a surface of the p-type layer that has been purified during processes of said cleaning treatment;

(e) removing a part of said current diffusion layer and said laminated semiconductor layers through etching to expose said n-type layer; and (f) forming electrodes on said n-type layer exposed by etching and said p-type layer, respectively in an electrical connected manner.

6. A method as claimed in claim 5, wherein said activation treatment is performed at a high temperature.

* * * * *